United States Patent
Balteanu et al.

(10) Patent No.: US 10,985,711 B2
(45) Date of Patent: Apr. 20, 2021

(54) WIDE BANDWIDTH ENVELOPE TRACKERS

(71) Applicant: Skyworks Solutions, Inc., Irvine, CA (US)

(72) Inventors: Florinel G. Balteanu, Irvine, CA (US); Serge Francois Drogi, Flagstaff, AZ (US); Sabah Khesbak, Irvine, CA (US); Hardik Bhupendra Modi, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/814,807

(22) Filed: Mar. 10, 2020

(65) Prior Publication Data
US 2020/0343865 A1    Oct. 29, 2020

Related U.S. Application Data

(63) Continuation of application No. 16/011,990, filed on Jun. 19, 2018, now Pat. No. 10,615,757.
(Continued)

(51) Int. Cl.
*H03F 3/195* (2006.01)
*H03F 1/02* (2006.01)
(Continued)

(52) U.S. Cl.
CPC .......... *H03F 3/195* (2013.01); *H03F 1/0238* (2013.01); *H03F 3/245* (2013.01);
(Continued)

(58) Field of Classification Search
CPC ...................................................... H03F 3/195
See application file for complete search history.

(56) References Cited

U.S. PATENT DOCUMENTS 5,264,752 A    11/1993   Savicki
6,407,634 B1    6/2002   Staudinger et al.
(Continued)

FOREIGN PATENT DOCUMENTS

GB    2398648    8/2004
GB    2409115    11/2006
(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
(Continued)

*Primary Examiner* — Patricia T Nguyen
(74) *Attorney, Agent, or Firm* — Knobbe, Martens, Olson & Bear, LLP

(57) ABSTRACT

High bandwidth envelope trackers are provided herein. In certain embodiments, an envelope tracking system for a power amplifier includes a switching regulator that operates in combination with a high bandwidth amplifier to generate a power amplifier supply voltage for the power amplifier based on an envelope of a radio frequency (RF) signal amplified by the power amplifier. The high bandwidth amplifier includes an output that generates an output current for adjusting the power amplifier supply voltage, a first input that receives a reference signal, and a second input that receives an envelope signal indicating the envelope of the RF signal. The second input has lower input impedance than the first input to provide a rapid transient response and high envelope tracking bandwidth.

20 Claims, 11 Drawing Sheets

Related U.S. Application Data

(60) Provisional application No. 62/522,951, filed on Jun. 21, 2017.

(51) Int. Cl.
*H03F 3/45* (2006.01)
*H03F 3/24* (2006.01)

(52) U.S. Cl.
CPC ... *H03F 3/45076* (2013.01); *H03F 2200/102* (2013.01); *H03F 2200/555* (2013.01)

(56) References Cited

U.S. PATENT DOCUMENTS

| | | | |
|---|---|---|---|
| 6,583,664 | B2 | 6/2003 | Mathe et al. |
| 6,646,501 | B1 | 11/2003 | Wessel |
| 6,914,487 | B1 | 7/2005 | Doyle et al. |
| 7,482,869 | B2 | 1/2009 | Wilson |
| 7,761,065 | B2 | 7/2010 | Drogi et al. |
| 8,000,409 | B2 | 8/2011 | Chan et al. |
| 8,094,764 | B2 | 1/2012 | Lackey |
| 8,183,917 | B2 | 5/2012 | Drogi et al. |
| 8,587,377 | B2 | 11/2013 | Khesbak et al. |
| 8,610,499 | B2 | 12/2013 | Royer |
| 8,620,238 | B2 | 12/2013 | Chan et al. |
| 8,680,833 | B2 | 3/2014 | Wilson |
| 8,731,496 | B2 | 5/2014 | Drogi et al. |
| 8,803,605 | B2 | 8/2014 | Fowers et al. |
| 8,947,162 | B2 | 2/2015 | Wimpenny et al. |
| 8,952,753 | B2* | 2/2015 | Tournatory ............. H02M 1/14 330/136 |
| 9,019,011 | B2 | 4/2015 | Hietala et al. |
| 9,065,385 | B2 | 6/2015 | Gorbachov |
| 9,066,368 | B2 | 6/2015 | Lorenz et al. |
| 9,225,362 | B2 | 12/2015 | Drogi et al. |
| 9,445,371 | B2 | 9/2016 | Khesbak et al. |
| 9,473,023 | B2 | 10/2016 | Vannorsdel et al. |
| 9,571,048 | B2 | 2/2017 | Ortiz |
| 9,667,196 | B2 | 5/2017 | Midya |
| 9,668,215 | B2 | 5/2017 | Balteanu et al. |
| 9,748,912 | B2 | 8/2017 | Choi et al. |
| 9,793,861 | B1 | 10/2017 | Somerville |
| 9,876,473 | B2 | 1/2018 | Khesbak et al. |
| 10,516,368 | B2 | 12/2019 | Balteanu et al. |
| 10,615,757 | B2 | 4/2020 | Balteanu et al. |
| 2002/0030543 | A1 | 3/2002 | French et al. |
| 2002/0101912 | A1 | 8/2002 | Phelts et al. |
| 2003/0155978 | A1 | 8/2003 | Pehlke |
| 2004/0083409 | A1 | 4/2004 | Rozenblit et al. |
| 2004/0198271 | A1 | 10/2004 | Kang |
| 2005/0064830 | A1 | 3/2005 | Grigore |
| 2005/0070233 | A1 | 3/2005 | Sowlati |
| 2005/0110562 | A1 | 5/2005 | Robinson et al. |
| 2006/0119425 | A1 | 6/2006 | Phillips et al. |
| 2007/0210771 | A1 | 9/2007 | Wilson et al. |
| 2007/0249304 | A1 | 10/2007 | Snelgrove et al. |
| 2007/0273449 | A1 | 11/2007 | Wilson |
| 2007/0279019 | A1 | 12/2007 | Wilson |
| 2008/0238387 | A1 | 10/2008 | Schmeller et al. |
| 2009/0004981 | A1 | 1/2009 | Eliezer et al. |
| 2009/0016086 | A1 | 1/2009 | Huynh et al. |
| 2009/0097591 | A1 | 4/2009 | Kim |
| 2009/0128236 | A1 | 5/2009 | Wilson |
| 2009/0289720 | A1 | 11/2009 | Takinami et al. |
| 2009/0302941 | A1 | 12/2009 | Wimpenny |
| 2011/0058601 | A1 | 3/2011 | Kim et al. |
| 2012/0139641 | A1 | 6/2012 | Kaczman et al. |
| 2012/0146731 | A1 | 6/2012 | Khesbak |
| 2012/0194274 | A1 | 8/2012 | Fowers et al. |
| 2012/0200354 | A1 | 8/2012 | Ripley et al. |
| 2012/0201065 | A1 | 8/2012 | Nate et al. |
| 2012/0269240 | A1 | 10/2012 | Balteanu et al. |
| 2012/0326783 | A1 | 12/2012 | Mathe et al. |
| 2013/0034139 | A1 | 2/2013 | Khlat et al. |
| 2013/0109441 | A1 | 5/2013 | Lorenz et al. |
| 2013/0109442 | A1 | 5/2013 | Dakshinamurthy et al. |
| 2013/0116017 | A1 | 5/2013 | Zhang et al. |
| 2013/0127548 | A1 | 5/2013 | Popplewell et al. |
| 2013/0200864 | A1 | 8/2013 | Huang et al. |
| 2013/0207731 | A1 | 8/2013 | Balteanu |
| 2013/0217345 | A1 | 8/2013 | Balteanu et al. |
| 2013/0231069 | A1 | 9/2013 | Drogi |
| 2013/0293210 | A1 | 11/2013 | Smith et al. |
| 2014/0049321 | A1 | 2/2014 | Gebeyehu et al. |
| 2014/0155127 | A1 | 6/2014 | Dakshinamurthy et al. |
| 2014/0213204 | A1 | 7/2014 | Balteanu et al. |
| 2014/0218109 | A1 | 8/2014 | Wimpenny |
| 2014/0232458 | A1* | 8/2014 | Arno ....................... H03F 3/189 330/127 |
| 2014/0240052 | A1 | 8/2014 | Mao |
| 2014/0300334 | A1 | 10/2014 | Popplewell et al. |
| 2014/0306763 | A1 | 10/2014 | Hong et al. |
| 2014/0312974 | A1 | 10/2014 | Khesbak et al. |
| 2014/0312977 | A1 | 10/2014 | Kaczman et al. |
| 2014/0361830 | A1 | 12/2014 | Mathe et al. |
| 2014/0361837 | A1 | 12/2014 | Strange et al. |
| 2015/0009980 | A1 | 1/2015 | Modi et al. |
| 2015/0091645 | A1 | 4/2015 | Park et al. |
| 2015/0105033 | A1 | 4/2015 | Modi et al. |
| 2015/0155834 | A1 | 6/2015 | Ripley et al. |
| 2015/0180421 | A1 | 6/2015 | Balteanu et al. |
| 2015/0188432 | A1 | 7/2015 | Vannorsdel et al. |
| 2015/0236654 | A1 | 8/2015 | Jiang et al. |
| 2015/0270806 | A1 | 9/2015 | Wagh et al. |
| 2015/0326184 | A1 | 11/2015 | Balteanu et al. |
| 2015/0365053 | A1 | 12/2015 | Wimpenny |
| 2016/0006396 | A1 | 1/2016 | Wimpenny |
| 2016/0006397 | A1 | 1/2016 | Wimpenny |
| 2016/0036389 | A1 | 2/2016 | Balteanu et al. |
| 2016/0050629 | A1 | 2/2016 | Khesbak et al. |
| 2016/0094192 | A1 | 3/2016 | Khesbak et al. |
| 2016/0099742 | A1 | 4/2016 | Ripley et al. |
| 2016/0118943 | A1 | 4/2016 | Khesbak |
| 2016/0156317 | A1 | 6/2016 | Inoue |
| 2016/0174153 | A1 | 6/2016 | Balteanu et al. |
| 2016/0248381 | A1 | 8/2016 | Yang |
| 2016/0261239 | A1 | 9/2016 | Khesbak et al. |
| 2016/0336901 | A1 | 11/2016 | Khesbak et al. |
| 2017/0005625 | A1 | 1/2017 | Zhu et al. |
| 2017/0033747 | A1 | 2/2017 | Balteanu et al. |
| 2017/0047953 | A1 | 2/2017 | Balteanu et al. |
| 2017/0093347 | A1 | 3/2017 | Zhu et al. |
| 2017/0093505 | A1 | 3/2017 | Ripley et al. |
| 2017/0179889 | A1 | 6/2017 | Khesbak et al. |
| 2017/0195972 | A1 | 7/2017 | Drogi et al. |
| 2017/0223632 | A1 | 8/2017 | Balteanu et al. |
| 2018/0034416 | A1 | 2/2018 | Duncan et al. |
| 2018/0076772 | A1 | 3/2018 | Khesbak et al. |
| 2018/0234060 | A1 | 8/2018 | Langer et al. |
| 2018/0287572 | A1 | 10/2018 | Oishi |
| 2018/0331659 | A1 | 11/2018 | Khesbak et al. |
| 2019/0222178 | A1* | 7/2019 | Khlat ..................... H03F 3/21 |
| 2019/0253023 | A1* | 8/2019 | Yang ..................... H03F 3/195 |
| 2020/0212855 | A1* | 7/2020 | Noguchi ............... H03F 1/0222 |
| 2020/0259458 | A1 | 8/2020 | Balteanu et al. |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

(56) References Cited

OTHER PUBLICATIONS

Kaneta et al. "Architecture of Wideband High-Efficiency Envelope Tracking Power Amplifier for Base Station," IEICE Technical Report, Osaka, 2009.
Kang et al. "A Multimode/Multiband Power Amplifier With a Boosted Supply Modulator," IEEE Transactions on Microwave Theory and Techniques, vol. 58, No. 10, Oct. 2010, pp. 2598-2608.
Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.
Wu et al. "A Two-Phase Switching Hybrid Supply Modulator for Polar Transmitters with 9% Efficiency Improvement," IEEE International Solid-State Circuits Conference, Feb. 2010, pp. 196-198.
Yousefzadeh et al. "Three-Level Buck Converter for Envelope Tracking Applications," IEEE Transactions on Power Electronics, vol. 21, No. 2, Mar. 2006, pp. 549-552.

* cited by examiner

WIDE BANDWIDTH ENVELOPE TRACKERS

CROSS-REFERENCE TO RELATED APPLICATIONS

This present application is a continuation of U.S. application Ser. No. 16/011,990, filed Jun. 19, 2018 and titled "WIDE BANDWIDTH ENVELOPE TRACKERS," which claims the benefit of priority under 35 U.S.C. § 119 of U.S. Provisional Patent Application No. 62/522,951, filed Jun. 21, 2017 and titled "WIDE BANDWIDTH ENVELOPE TRACKERS," which is herein incorporated by reference in its entirety herein

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 450 MHz to about 6 GHz for certain communications standards.

SUMMARY

In certain embodiments, the present disclosure relates to a mobile device. The mobile device includes a transceiver configured to generate a radio frequency transmit signal, a front end circuit including a power amplifier configured to amplify the radio frequency transmit signal, and a power management circuit including an envelope tracker configured to generate a power amplifier supply voltage of the power amplifier. The envelope tracker includes a differential amplifier including an output configured to provide an output current operable to adjust a voltage level of the power amplifier supply voltage, a first input configured to receive a reference voltage, and a second input configured to receive an envelope signal that changes in relation to an envelope of the radio frequency transmit signal. The second input has an input impedance than is lower than an input impedance of the first input.

In some embodiment embodiments, the differential amplifier includes an amplification circuit biased by a control signal, and an input current reduction circuit configured to adjust the control signal via feedback so as to reduce an input current to the second input. According to a number of embodiments, the input current reduction circuit includes a first voltage divider electrically connected between the output and the second input and operable to control the second input. In accordance with various embodiments, the input current reduction circuit includes a second voltage divider connected between the output and the second input and operable to provide a second divided voltage, and a control amplifier configured to generate the control signal based on a voltage difference between the first divided voltage and the second divided voltage.

In several embodiments, the input impedance of the second input is at least ten times lower than the input impedance of the first input.

In a number of embodiments, the input impedance of the second input is less than the input impedance of the first input at least over a frequency range of the envelope signal.

In various embodiments, the first input connects to a transistor gate, and the second input connects to at least one of a transistor source or a transistor drain.

In some embodiments, the first input connects to a differential input buffer and the second input does not connect to any differential input buffer.

In several embodiments, the envelope tracker further includes a switching regulator configured to generate a regulated voltage, and a combiner configured to combine the regulated voltage and the output current to generate the power amplifier supply voltage. According to a number of embodiments, the envelope tracker further includes a current source connected to the second input and a tracking circuit connected to the combiner and configured to control a current of the current source. In accordance with various embodiments, the differential amplifier is further configured to generate a sense signal that tracks the output current, and the switching regulator configured to generate the regulated voltage based on the sense signal.

In certain embodiments, the present disclosure relates to an envelope tracking system. The envelope tracking system includes a power amplifier configured to amplify a radio frequency signal, and an envelope tracker configured to generate a power amplifier supply voltage of the power amplifier. The envelope tracker includes a differential amplifier including an output configured to provide an output current operable to adjust a voltage level of the power amplifier supply voltage, a first input configured to receive a reference voltage, and a second input configured to receive an envelope signal that changes in relation to an envelope of the radio frequency signal. The second input has an input impedance that is lower than an input impedance of the first input.

In various embodiments, the differential amplifier includes an amplification circuit biased by a control signal, and an input current reduction circuit configured to adjust the control signal via feedback so as to reduce an input current to the second input. According to a number of embodiments, the input current reduction circuit includes a pair of voltage dividers electrically connected in parallel between the output and the second input, and the input current reduction circuit is configured to generate the control signal based on a voltage difference between the pair of voltage dividers.

In several embodiments, the input impedance of the second input is at least ten times lower than the input impedance of the first input.

In a number of embodiments, the first input connects to a transistor gate, and the second input connects to at least one of a transistor source or a transistor drain.

In some embodiments, the envelope tracker further includes a switching regulator configured to generate a regulated voltage, and a combiner configured to combine the regulated voltage and the output current to generate the power amplifier supply voltage.

In certain embodiments, the present disclosure relates to a method of envelope tracking. The method includes amplifying a radio frequency signal using a power amplifier, and generating a power amplifier supply voltage of the power amplifier using an envelope tracker that includes a differential amplifier having a first input of a first input impedance and a second input of a second input impedance less than the first input impedance. Generating the power amplifier supply voltage includes receiving a reference voltage at the first input, receiving an envelope signal that changes in relation to an envelope of the radio frequency signal at the second input, and adjusting a voltage level of the power amplifier supply voltage using an output current of the differential amplifier.

In several embodiments, the method further includes generating a control signal based on providing feedback from an output of the differential amplifier to the second input of the differential amplifier, and reducing an input current to the second input by biasing the differential amplifier with the control signal.

In a number of embodiments, generating the power amplifier supply voltage further includes generating a regulated voltage using a switching regulator of the envelope tracker, and combining the regulated voltage and the output current using a combiner. In accordance with some embodiments, the method further includes generating a sense signal that tracks the output current using the differential amplifier, and controlling the switching regulator using the sense signal.

DETAILED DESCRIPTION OF EMBODIMENTS

Figure 1:
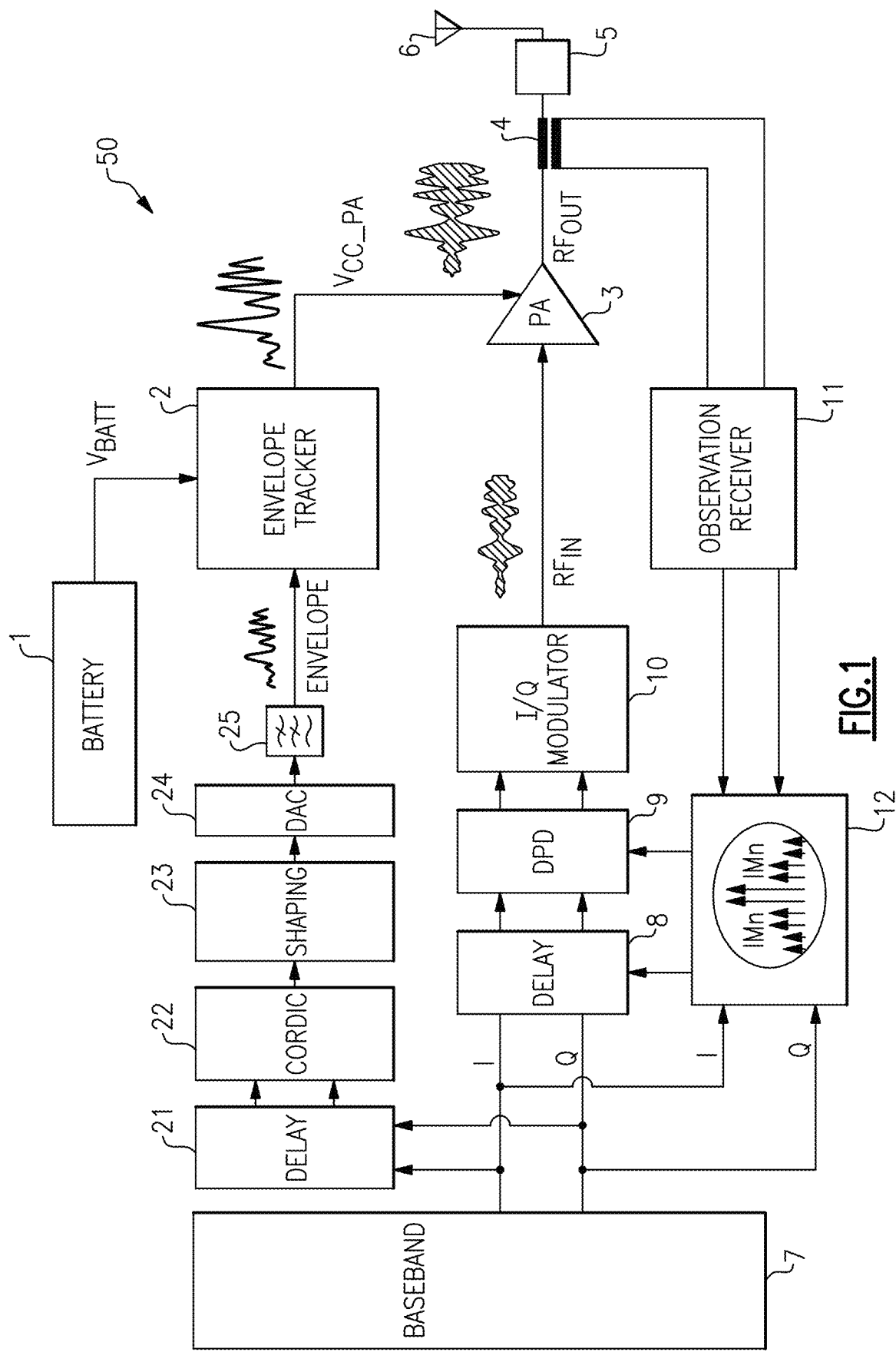
FIG. 1 is a schematic diagram of one embodiment of a communication system for transmitting radio frequency (RF) signals.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Envelope tracking is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

High bandwidth envelope trackers are provided herein. In certain embodiments, an envelope tracking system for a power amplifier includes a DC-to-DC converter that operates in combination with a high bandwidth amplifier to generate a power amplifier supply voltage for the power amplifier based on an envelope of an RF signal amplified by the power amplifier. The high bandwidth amplifier includes an output that generates an output current for adjusting the power amplifier supply voltage, a first input that receives a reference signal, and a second input that receives an envelope signal indicating the envelope of the RF signal. The second input has lower input impedance than the first input to provide a rapid transient response and high envelope tracking bandwidth.

For example, the second input can source or sink a relatively large current to quickly charge or discharge internal capacitances of the high bandwidth amplifier to provide a fast transient response. The second input can have lower input impedance than the first input at least over a frequency range of the envelope signal. In contrast, when an envelope tracker's amplifier includes a pair of inputs with high input impedance, a resistor-capacitor (RC) time constant associated with charging or discharging capacitances can be relatively large. Thus, such envelope trackers can operate with a delay that degrades the envelope tracking system's bandwidth.

In certain configurations, the high bandwidth amplifier includes an input current reduction circuit for dynamically adjusting a control signal of the high bandwidth amplifier to reduce an amount of input current flowing into or out of the second input. For example, in certain implementations the input current reduction circuit controls a voltage level of a control voltage of the high bandwidth amplifier's amplification circuitry to a bias point associated with low input current and fast envelope tracking.

Accordingly, an input current reduction circuit can dynamically bias the high bandwidth amplifier to provide wide envelope tracking bandwidth, for instance, 180 MHz or more of modulation bandwidth.

In certain configurations, the second input of the high bandwidth amplifier that receives the envelope signal can be of much lower input impedance the first input that receives the reference voltage. In one example, the second input can connect to FET drain and/or source regions, while the first input can connect to a gate region of much higher impedance. In another example, an input impedance of the second input is at least ten times lower than an input impedance of the first input.

By providing the envelope signal to a low impedance input of an amplifier, a relatively large current can be sourced or sunk as needed to quickly charge or discharge the amplifier's internal capacitances. In contrast, when an envelope tracker's amplifier includes a pair of inputs with high input impedance, an RC time constant associated with charging and discharging capacitances can be relatively large.

In certain implementations, the high bandwidth amplifier also generates a sense signal, such as a sense current, that tracks the output current. The sense signal can be used in a wide variety of ways to enhance the performance of the envelope tracking system. For example, the DC-to-DC current can use the sense signal in part to generate a regulated voltage, which is adjusted by the output current from the high bandwidth amplifier to generate the power amplifier supply voltage.

FIG. 1 is a schematic diagram of one embodiment of a communication system 50 for transmitting RF signals. The communication system 50 includes a battery 1, an envelope tracker 2, a power amplifier 3, a directional coupler 4, a duplexing and switching circuit 5, an antenna 6, a baseband processor 7, a signal delay circuit 8, a digital pre-distortion (DPD) circuit 9, an I/Q modulator 10, an observation receiver 11, an intermodulation detection circuit 12, an envelope delay circuit 21, a coordinate rotation digital computation (CORDIC) circuit 22, a shaping circuit 23, a digital-to-analog converter 24, and a reconstruction filter 25.

The communication system 50 of FIG. 1 illustrates one example of an RF system that can include an envelope tracking system implemented in accordance with one or more features of the present disclosure. However, the teachings herein are applicable to RF systems implemented in a wide variety of ways.

The baseband processor 7 operates to generate an in-phase (I) signal and a quadrature-phase (Q) signal, which correspond to signal components of a sinusoidal wave or signal of a desired amplitude, frequency, and phase. For example, the I signal and the Q signal provide an equivalent representation of the sinusoidal wave. In certain implementations, the I and Q signals are outputted in a digital format. The baseband processor 7 can be any suitable processor for processing baseband signals. For instance, the baseband processor 7 can include a digital signal processor, a microprocessor, a programmable core, or any combination thereof.

The signal delay circuit 8 provides adjustable delay to the I and Q signals to aid in controlling relative alignment between the envelope signal provided to the envelope tracker 2 and the RF signal $RF_{IN}$ provide to the power amplifier 3. The amount of delay provided by the signal delay circuit 8 is controlled based on amount of intermodulation in adjacent bands detected by the intermodulation detection circuit 12.

The DPD circuit 9 operates to provide digital shaping to the delayed I and Q signals from the signal delay circuit 8 to generate digitally pre-distorted I and Q signals. In the illustrated embodiment, the digital shaping provided by the DPD circuit 9 is controlled based on amount of intermodulation detected by the intermodulation detection circuit 12. The DPD circuit 9 serves to reduce a distortion of the power amplifier 3 and/or to increase the efficiency of the power amplifier 3.

The I/Q modulator 10 receives the digitally pre-distorted I and Q signals, which are processed to generate the RF signal $RF_{IN}$. For example, the I/Q modulator 10 can include DACs configured to convert the digitally pre-distorted I and Q signals into an analog format, mixers for upconverting the analog I and Q signals to radio frequency, and a signal combiner for combining the upconverted I and Q signals into the RF signal $RF_{IN}$. In certain implementations, the I/Q modulator 10 can include one or more filters configured to filter frequency content of signals processed therein.

The envelope delay circuit 21 delays the I and Q signals from the baseband processor 7. Additionally, the CORDIC circuit 22 processes the delayed I and Q signals to generate a digital envelope signal corresponding to a digital representation of an envelope of the RF signal $RF_{IN}$. Although FIG. 1 illustrates an implementation using the CORDIC circuit 22, an envelope signal can be obtained in other ways.

The shaping circuit 23 operates to shape the digital envelope signal to enhance the performance of the communication system 50. In certain implementations, the shaping circuit 23 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24 to an analog envelope signal. Additionally, the analog envelope signal is filtered by the reconstruction filter 25 to generate an envelope signal suitable for use by the envelope tracker 2. In certain implementations, the reconstruction filter 25 includes a low pass filter.

With continuing reference to FIG. 1, the envelope tracker 2 receives the envelope signal from the reconstruction filter 25 and a battery voltage $V_{BATT}$ from the battery 1, and uses the envelope signal to generate a power amplifier supply voltage $V_{CC\_PA}$ for the power amplifier 3 that changes in relation to the envelope of the RF signal $RF_{IN}$. The power amplifier 3 receives the RF signal $RF_{IN}$ from the I/Q modulator 10, and provides an amplified RF signal $RF_{OUT}$ to the antenna 6 through the duplexing and switching circuit 5, in this example.

The directional coupler 4 is positioned between the output of the power amplifier 3 and the input of the duplexing and switching circuit 5, thereby allowing a measurement of output power of the power amplifier 3 that does not include insertion loss of the duplexing and switching circuit 5. The sensed output signal from the directional coupler 4 is provided to the observation receiver 11, which can include mixers for providing down conversion to generate downconverted I and Q signals, and DACs for generating I and Q observation signals from the downconverted I and Q signals.

The intermodulation detection circuit 12 determines an intermodulation product between the I and Q observation signals and the I and Q signals from the baseband processor 7. Additionally, the intermodulation detection circuit 12 controls the DPD provided by the DPD circuit 9 and/or a delay of the signal delay circuit 8 to control relative alignment between the envelope signal and the RF signal $RF_{IN}$. In another embodiment, the intermodulation detection circuit 12 additionally or alternatively controls a delay of the signal delay circuit 21.

By including a feedback path from the output of the power amplifier 3 and baseband, the I and Q signals can be dynamically adjusted to optimize the operation of the communication system 50. For example, configuring the communication system 50 in this manner can aid in providing power control, compensating for transmitter impairments, and/or in performing DPD.

Although illustrated as a single stage, the power amplifier 3 can include multiple stages. Furthermore, the teachings herein are applicable to communication systems including multiple power amplifiers.

Figure 2A:
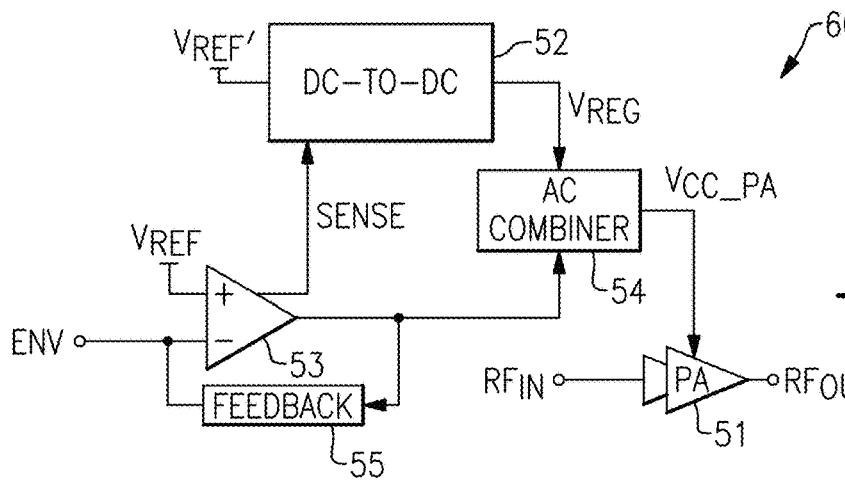
FIG. 2A is a schematic diagram of one embodiment of an envelope tracking system for a power amplifier.
Figure 2B:
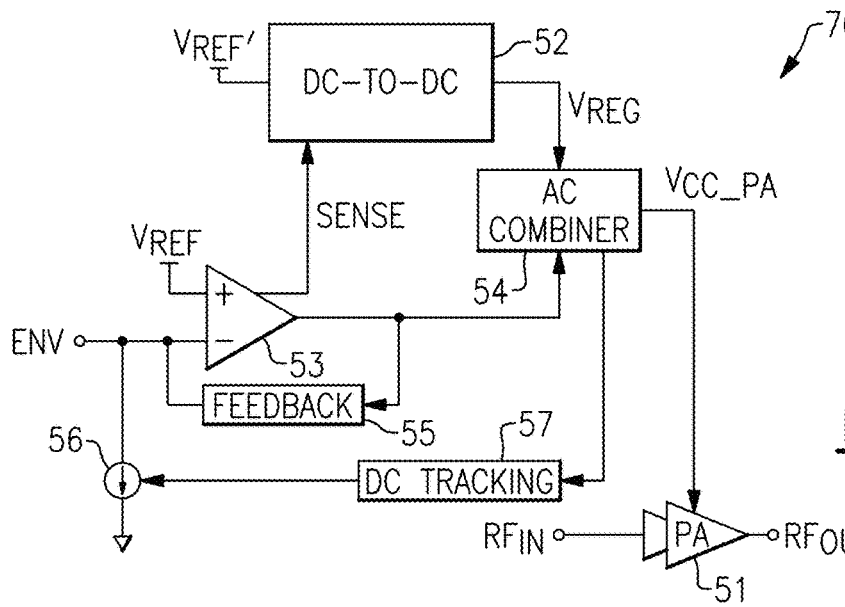
FIG. 2B is a schematic diagram of another embodiment of an envelope tracking system for a power amplifier.
Figure 2C:
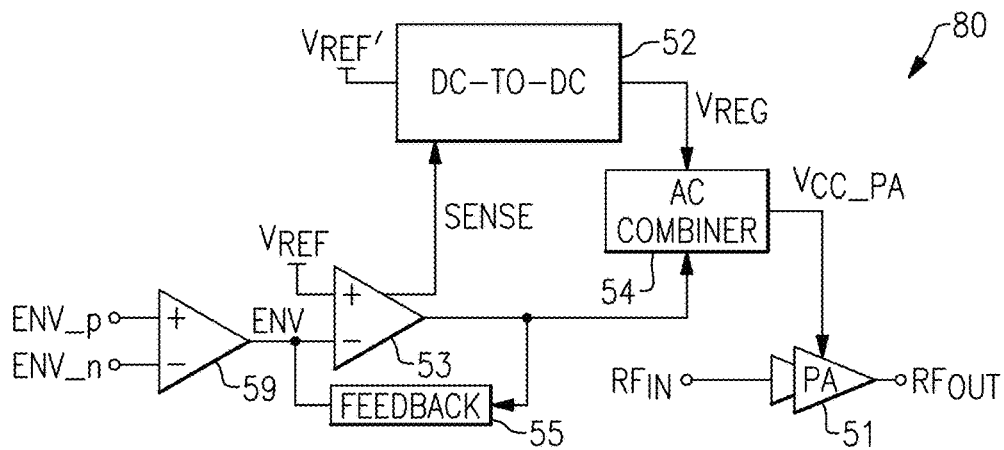
FIG. 2C is a schematic diagram of another embodiment of an envelope tracking system for a power amplifier.
Figure 3:
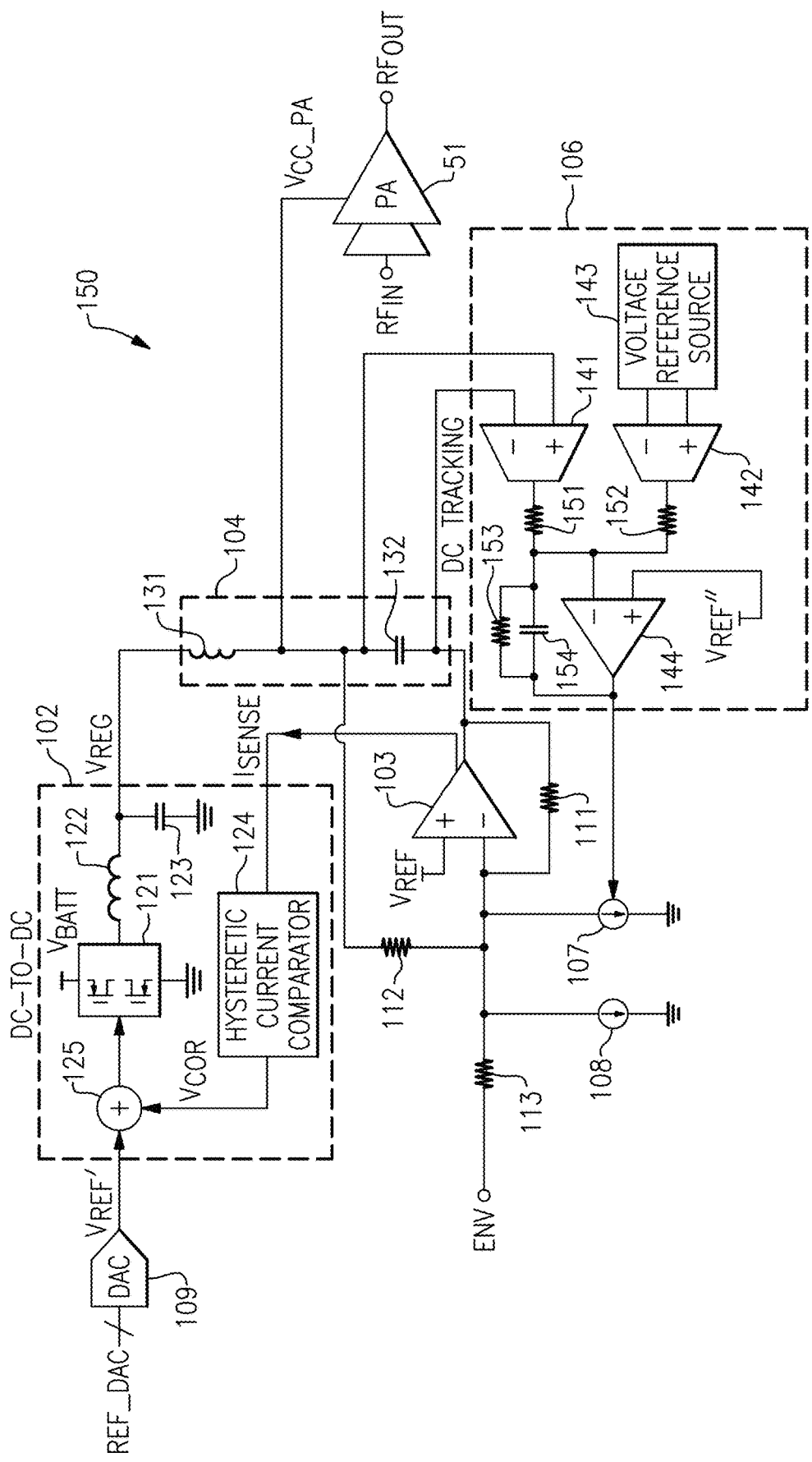
FIG. 3 is a schematic diagram of another embodiment of an envelope tracking system for a power amplifier.

FIGS. 2A-3 are schematic diagram of various embodiments of envelope tracking systems for a power amplifier. The envelope tracking systems of FIGS. 2A-3 illustrate various embodiments of envelope tracking systems that provide fast envelope tracking. However, the teachings herein are applicable to envelope trackers implemented in a wide variety of ways. Accordingly, other implementations are possible.

FIG. 2A is a schematic diagram of one embodiment of an envelope tracking system 60 for a power amplifier 51. The envelope tracking system 60 includes a DC-to-DC converter 52, a high bandwidth amplifier 53, an AC combiner 54, and a feedback circuit 55. The high bandwidth amplifier 53 is implemented in accordance with one or more features of the present disclosure.

In the illustrated embodiment, the DC-to-DC converter 52 operates to generate a regulated voltage $V_{REG}$ based on a DC-to-DC reference voltage $V_{REF'}$ and a sense signal SENSE from the high bandwidth amplifier 53. The DC-to-DC converter 52 can be implemented in a wide variety of ways including, but not limited to, using a buck converter, a boost converter, or a buck-boost converter. The DC-to-DC converter 52 is also referred to herein as a switching regulator.

The sense signal SENSE serves to track changes in an envelope signal ENV. For example, the sense signal SENSE can change in relation to an output current of the high bandwidth amplifier 53. However, other implementations are possible.

The high bandwidth amplifier 53 includes a first input that receives a reference voltage $V_{REF}$ and a second input that receives the envelope signal ENV. In the illustrated embodiment, the first input is a non-inverting input and the second input is an inverting input. However, other implementations are possible.

The high bandwidth amplifier 53 further includes an output that is electrically connected to the second input via the feedback circuit 55. The feedback circuit 55 can be implemented in a wide variety of ways. In one example, the feedback circuit 55 includes at least one of a resistor or a capacitor, for instance, a parallel combination of a resistor and a capacitor.

The AC combiner 54 operates to combine the output of the DC-to-DC converter 52 and the output of the high bandwidth amplifier 53 to generate a power amplifier supply voltage $V_{CC\_PA}$ for the power amplifier 51. The power amplifier 51 amplifies an RF input signal $RF_{IN}$ to generate an RF output signal $RF_{OUT}$. The envelope tracking system 60 receives the envelope signal ENV, which changes in relation to an envelope of the RF input signal $RF_{IN}$.

With continuing reference to FIG. 2A, the inverting input of the high bandwidth amplifier 53 that receives the envelope signal ENV is implemented with lower input impedance relative to the non-inverting input that receives the reference voltage $V_{REF}$. For example, with respect to internal amplification circuitry of the high bandwidth amplifier 53, the inverting input can connect to transistor drain and/or source regions, while the non-inverting input can connect to a transistor gate region of much higher impedance.

By providing the envelope signal to a low impedance input, a relatively large current can be sourced or sunk as needed to quickly charge or discharge internal capacitances of the amplifier 53. In contrast, when an envelope tracker's amplifier includes a pair of inputs with high input impedance, an RC time constant associated with charging and discharging capacitances can be relatively large.

FIG. 2B is a schematic diagram of another embodiment of an envelope tracking system 70 for a power amplifier. The envelope tracking system 70 includes a DC-to-DC converter 52, a high bandwidth amplifier 53, an AC combiner 54, a feedback circuit 55, a current source 56, and a DC tracking circuit 57.

The envelope tracking system 70 of FIG. 2B is similar to the envelope tracking system 60 of FIG. 2A, except that the envelope tracking system 70 further includes the current source 56 and the DC tracking circuit 57.

The current source 56 is electrically connected to the second input of the high bandwidth amplifier 53, and provides a current that is controlled by the DC tracking circuit 57. The DC tracking circuit 57 monitors the AC combiner 54 (for instance, one or more currents and/or voltages), and adjusts the current of the current source 56 to maintain suitable DC biasing levels.

FIG. 2C is a schematic diagram of another embodiment of an envelope tracking system 80 for a power amplifier. The envelope tracking system 80 includes a DC-to-DC converter 52, a high bandwidth amplifier 53, an AC combiner 54, a feedback circuit 55, and a differential amplifier 59.

The envelope tracking system 80 of FIG. 2C is similar to the envelope tracking system 60 of FIG. 2A, except that the envelope tracking system 80 further includes the differential envelope amplifier 59. As shown in FIG. 2C, the differential envelope amplifier 59 generates the envelope signal ENV based on a differential envelope signal including a non-inverted signal component ENV_p and an inverted signal component ENV_n. Including the differential envelope amplifier 59 can enhance system performance by providing superior noise rejection.

FIG. 3 is a schematic diagram of another embodiment of an envelope tracking system 150 for a power amplifier 51. The envelope tracking system 150 includes a DC-to-DC converter 102, a high bandwidth amplifier 103, an AC combiner 104, a DC tracking circuit 106, a first current source 107, a second current source 108, a DAC 109, a first feedback resistor 111, a second feedback resistor 112, and an input resistor 113.

The DC-to-DC converter 102 includes a switcher 121, an inductor 122, an output capacitor 123, a hysteretic current comparator 124, and a voltage adder 125. The DAC 109 receives a digital reference signal REF_DAC, which controls a voltage of the DC-to-DC reference voltage $V_{REF'}$ generated by the DAC 109. In certain implementations, the digital reference signal REF_DAC is received over an interface, for instance, a serial bus such as the Mobile Industry Peripheral Interface (MIPI) Radio Frequency Front-End Control Interface (RFFE) bus 651 of FIG. 10.

The hysteretic current comparator 124 processes a sense current $I_{SENSE}$ from the high bandwidth amplifier 103 to generate a correction voltage $V_{COR}$. The voltage adder 125 adds the correction voltage $V_{COR}$ and the DC-to-DC reference voltage $V_{REF'}$ to generate a control voltage of the switcher 121. The switcher 121 receives a battery voltage $V_{BATT}$ and a ground voltage, and controls a current flowing through the inductor 122 over time to control a voltage level of a regulated voltage $V_{REG}$ at the output of the DC-to-DC converter 102.

Including the hysteretic current comparator 124 aids in controlling the voltage level of the regulated voltage $V_{REG}$ based on the sense current $I_{SENSE}$ so as to reduce an average output current of the high bandwidth amplifier 103. Since the DC-to-DC converter 102 can have a higher efficiency than that of the high bandwidth amplifier 103, reducing the average output current of the high bandwidth amplifier 103 can improve the overall efficiency of the envelope tracking system 150.

The AC combiner 104 includes an inductor 131 and an AC coupling capacitor 132. As shown in FIG. 3, the inductor 131 is connected between the regulated voltage $V_{REG}$ and the power amplifier supply voltage $V_{CC\_PA}$, and the AC coupling capacitor 132 is connected between the power amplifier supply voltage $V_{CC\_PA}$ and the output of the high bandwidth amplifier 103.

In the illustrated embodiment, the first feedback resistor 111 is connected between the output and inverting input of the high bandwidth amplifier 103. Additionally, the second feedback resistor 112 is connected between the power amplifier supply voltage $V_{CC\_PA}$ and the inverting input of the high bandwidth amplifier 103. Although one example of feedback for a high bandwidth amplifier is shown, a wide variety of implementations of feedback can be used.

With continuing reference to FIG. 3, the envelope signal ENV is provided to the inverting input of the high bandwidth amplifier 103 via the input resistor 113. Additionally, the non-inverting input of the high bandwidth amplifier 103 receives the reference voltage $V_{REF}$. The high bandwidth amplifier 103 generates an output current, which is provided to the power amplifier supply voltage $V_{CC\_PA}$ via the capacitor 132 to provide voltage level adjustment to the power amplifier supply voltage $V_{CC\_PA}$. In the illustrated embodiment, the high bandwidth amplifier 103 also generates the sense current $I_{SENSE}$, which changes in relation to the amplifier's output current.

In the illustrated embodiment, the inverting input of the high bandwidth amplifier 103 that receives the envelope signal ENV is implemented with lower input impedance relative to the non-inverting input that receives the reference voltage $V_{REF}$. Thus, the high bandwidth amplifier 103 provides fast envelope tracking.

The first current source 107 and the second current source 108 are electrically connected in parallel with one another between the inverting input of the high bandwidth amplifier 103 and ground. The DC tracking circuit 106 controls a current of the first current source 107 based on a voltage across the capacitor 132. In particular, the DC tracking circuit 106 controls the current to maintain the voltage across the capacitor 132 relatively constant, thereby helping to maintain sufficient voltage headroom and suitable DC biasing at the output of the high bandwidth amplifier 103.

In the illustrated embodiment, the DC tracking circuit 106 includes a first amplifier 141, a second amplifier 142, a voltage reference source 143, an output amplifier 144, a first resistor 151, a second resistor 152, a third resistor 153, and a capacitor 154. The first amplifier 141 receives the voltage across the capacitor 132, and the second amplifier 142 receives the voltage from the voltage reference source 143. In this example, the first and second amplifiers 141, 141 are transconductance amplifiers, and the output amplifier 144 is a voltage amplifier.

The DC tracking circuit 106 serves to control the current of the first current source 107 such that the voltage across the capacitor 132 is about equal to that of the voltage reference source 143. For example, when the voltages are equal, the inverting input of the output amplifier 144 is about equal to the reference voltage $V_{REF''}$. However, when the voltages are unequal, the first amplifier 141 generates a voltage change to the inverting input of the output amplifier 144, which in turn adjusts the current of the first current source 107 to provide DC tracking.

Figure 4:
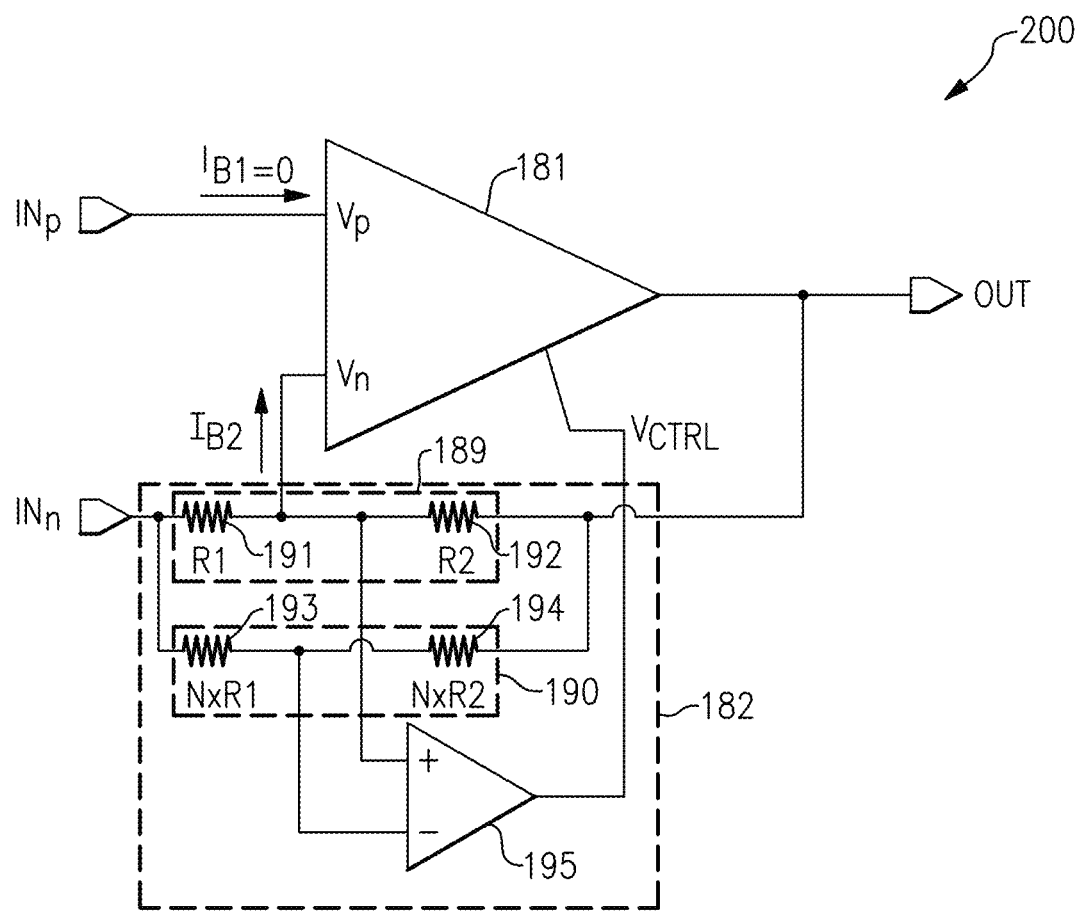
FIG. 4 is a schematic diagram of one embodiment of a high bandwidth amplifier for an envelope tracking system.

FIG. 4 is a schematic diagram of one embodiment of a high bandwidth amplifier 200 for an envelope tracking system. The high bandwidth amplifier 200 includes a differential amplification circuit 181 and an input current reduction circuit 182.

The high bandwidth amplifier 200 of FIG. 4 illustrates one embodiment of the high bandwidth amplifier of FIGS. 2A-3. Although one example of a high bandwidth amplifier is shown, the high bandwidth amplifier of FIGS. 2A-3 can be implemented in other ways.

The differential amplification circuit 181 serves to provide amplification between a first input $IN_p$ and a second input $IN_n$, which receive a reference signal and an envelope signal, respectively. The differential amplification circuit 181 further generates an output current on the output OUT. The output current is used to adjust a voltage level of a power amplifier supply voltage.

With continuing reference to FIG. 4, the differential amplification circuit 181 includes a first input $V_p$ with relatively high input impedance and a second input $V_n$ with relatively low input impedance. The differential amplification circuit 181 has been annotated to show a first input current $I_{B1}$ into the first input $V_p$ of about 0 mA, and a second input current $I_{B2}$ into the second input $V_n$.

Implementing the second input $V_n$ of the differential amplification circuit 181 with low input impedance provides a rapid transient response and high envelope tracking bandwidth, since the envelope signal is provided to the second input $V_n$. For example, the second input $V_n$ can source or sink a relatively large current to quickly charge or discharge internal capacitances of the differential amplification circuit 181 to provide a fast transient response. In certain configurations, an input impedance into the second input $V_n$ is at least a factor of ten lower than an input impedance into the first input $V_p$.

As shown in FIG. 4, the input current reduction circuit 182 controls a control voltage $V_{CTRL}$ of the differential amplification circuit 181. As a voltage level of the control voltage $V_{CTRL}$ changes, biasing of the differential amplification circuit 181 varies, which results in the input current $I_{B2}$ into the second input $V_n$ changing.

The input current reduction circuit 182 serves to dynamically adjust the control voltage $V_{CTRL}$ to reduce the input current $I_{B2}$. Biasing the differential amplification circuit 181 at a bias level in which the input current $I_{B2}$ is relatively small further enhances the speed of amplification circuitry. For example, the differential amplification circuit 181 can rapidly respond to an increase or decrease in the envelope signal when biased in this manner.

Accordingly, including the input current reduction circuit 182 aids in providing wide envelope tracking bandwidth, for instance, 180 MHz or more of modulation bandwidth.

In the illustrated embodiment, the input current reduction circuit 182 includes a first voltage divider 189 including a first resistor 191 of resistance R1 and a second resistor 192 of resistance R2 connected in series between the second input $IN_n$ and the output OUT. The second input $IN_n$ is connected to the differential amplification circuit 181 via the first resistor 191, and thus the first voltage divider 189 serves to detect changes in the second input current $I_{B2}$. The input current reduction circuit 182 further includes a second voltage divider 190 including a third resistor 193 of resistance N*R1 and a fourth resistor 194 of resistance N*R2 connected in series between the second input $IN_n$ and the output OUT. The input current reduction circuit 182 further includes a control amplifier 195 configured to generate the control voltage $V_{CTRL}$ based on a voltage difference between a first divided voltage generated by the first voltage divider 189 and a second divided voltage generated by the second voltage divider 190.

In certain implementations, N is greater than one, for example, by a factor of 5 or more, thereby implementing the second voltage divider 190 with greater resistivity than the first voltage divider 189.

Figure 5:
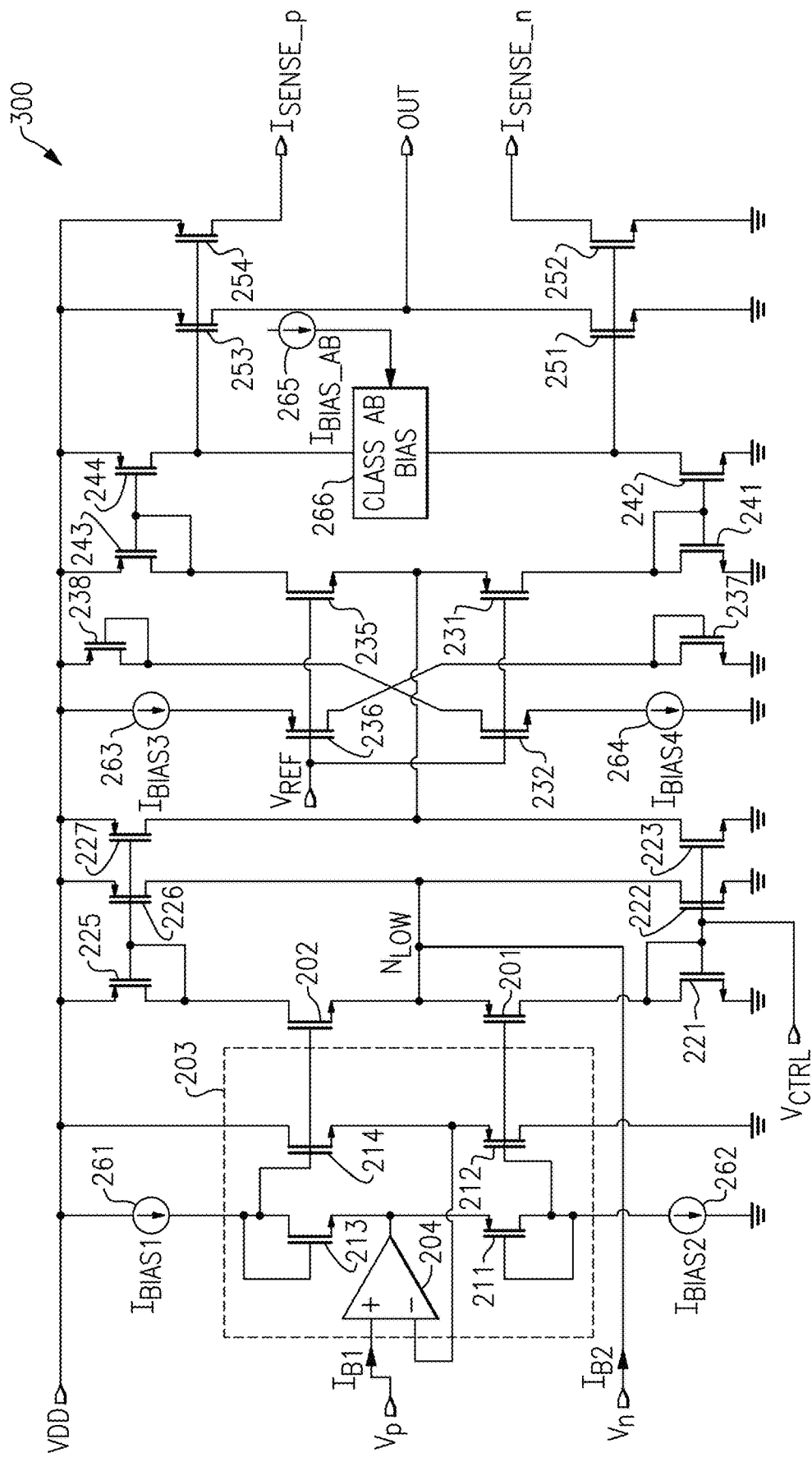
FIG. 5 is a schematic diagram of one embodiment of a differential amplification circuit for the high bandwidth amplifier of FIG. 4.

FIG. 5 is a schematic diagram of one embodiment of a differential amplification circuit 300 for the high bandwidth amplifier 200 of FIG. 4. Although one example of a suitable differential amplification circuit is shown, a high bandwidth amplifier can include amplification circuitry implemented in a wide variety of ways.

As shown in FIG. 5, the differential amplification circuit 300 includes p-type field-effect transistors (PFETs) 201, 211, 212, 225, 226, 227, 231, 236, 238, 243, 244, 253, and 254. The differential amplification circuit 300 further includes n-type field-effect transistors (NFETs) 202, 213, 214, 221, 222, 223, 232, 235, 237, 241, 242, 251, and 252. The differential amplification circuit 300 further includes first to fourth bias current sources 261-264, respectively, a class AB current source 265, and a class AB bias circuit 266. Additionally, the differential amplification circuit 300 includes a buffer 204. As shown in FIG. 5, the buffer 204, the PFET 211, the PFET 212, the NFET 213, and the NFET 214 operate as a first input circuit 203. The buffer circuit 204 includes a positive input of high impedance (for instance, a transistor gate), and a negative input of high impedance (for instance, a transistor gate).

The differential amplification circuit 300 includes a first input $V_p$ and a second input $V_n$, which are of different input impedance. In particular, the first input $V_p$ is connected to the buffer 204, which can include a transistor gate and/or other high input impedance elements. In contrast, the second input $V_n$ connects to sources of PFET 201 and NFET 202 and drains of NFET 222 and PFET 226 at a low impedance node $N_{LOW}$.

By implementing the second input $V_n$ that receives the envelope signal with low impedance, the second input $V_n$ can source or sink a relatively large current to quickly charge or discharge internal capacitances of the differential amplification circuit 300 in response to changes in the envelope signal. Thus, high bandwidth is provided.

The differential amplification circuit 300 generates an output current at an output OUT, and a differential sense current at outputs $I_{SENSE\_p}$ and $I_{SENSE\_n}$. Additionally, the differential amplification circuit 300 operates with a class AB bias circuit 266 to provide a push-pull output stage for enhanced bandwidth. The differential amplification circuit 300 is also implemented to operate with relatively low swing of internal nodes, thus further providing fast transient response by reducing the amount of charging and discharging needed to respond to a change in the envelope signal.

With continuing reference to FIG. 5, the differential amplification circuit 300 receives a reference voltage $V_{REF}$, which can be the same or a different reference voltage from the reference voltage $V_{REF}$ of FIGS. 2A-3.

The differential amplification circuit 300 further receives the control voltage $V_{CTRL}$, which can be controlled by an input current reduction circuit, such as the input current reduction circuit 182 of FIG. 4.

Figure 6A:
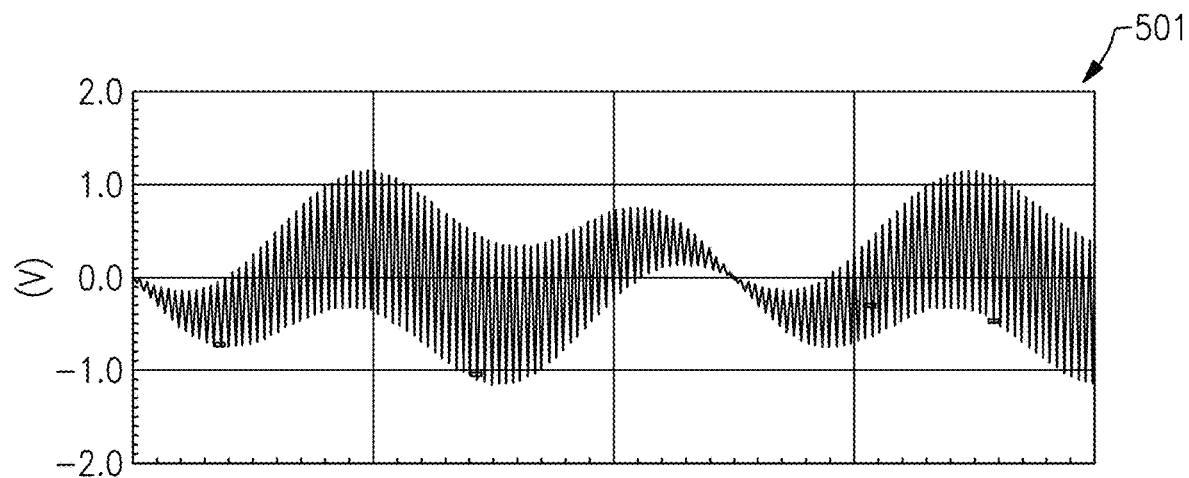
FIG. 6A is one example of a graph of voltage for versus time for an envelope tracking system.

FIG. 6A is one example of a graph 501 of voltage for versus time for an envelope tracking system. The graph 501 corresponds to a three tone simulation including a tone of 1 megahertz (MHz), 84 MHz, and 85 MHz. Although the graph 501 shows results for one example of an envelope tracking system implemented in accordance with the teachings herein, other results are possible. For example, the performance characteristics of an envelope tracking system can depend on implementation, application, simulation or lab setup, operating conditions, and/or a wide variety of other factors.

Figure 6B:
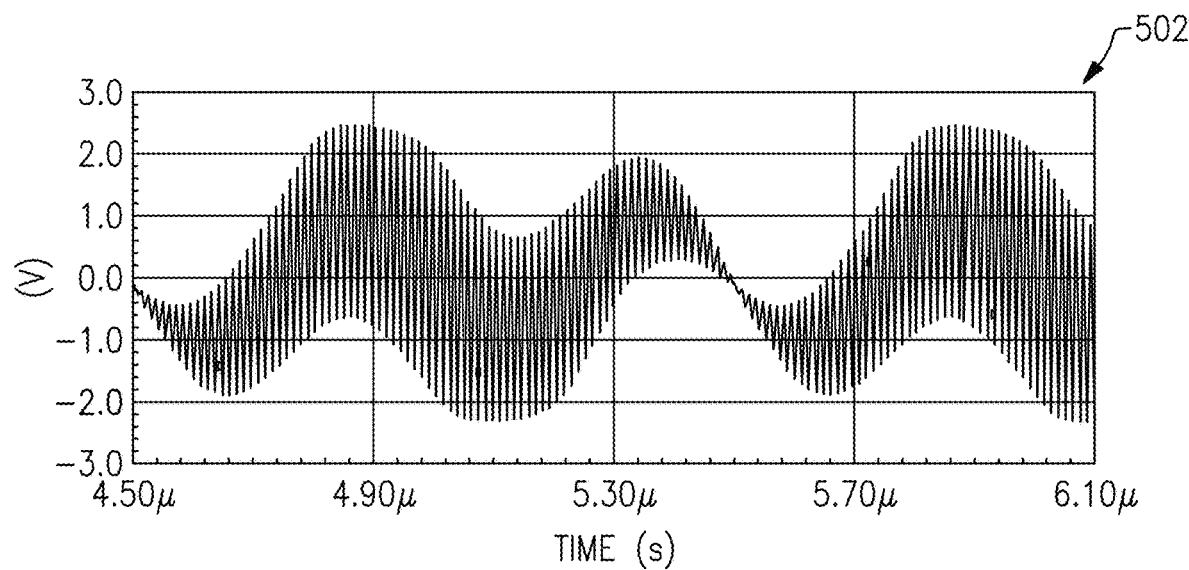
FIG. 6B is another example of a graph of voltage for versus time for an envelope tracking system.

FIG. 6B is another example of a graph 502 of voltage for versus time for an envelope tracking system. The graph 502 corresponds to a three tone simulation including a tone of 1 MHz, 84 MHz, and 85 MHz. The graph 501 and the graph 502 are simulated for different load conditions of the envelope tracking system.

Figure 7:
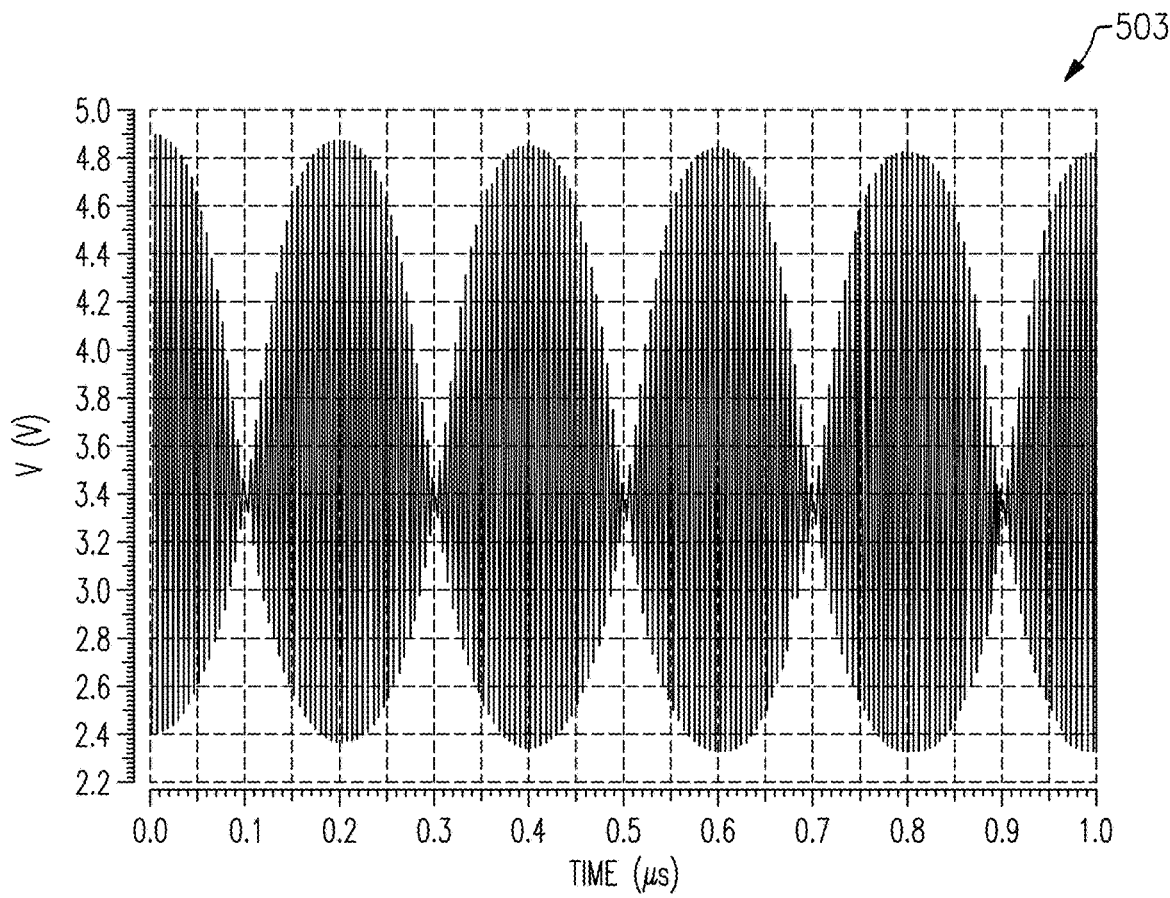
FIG. 7 is another example of a graph of voltage for versus time for an envelope tracking system.

FIG. 7 is another example of a graph 503 of voltage for versus time for an envelope tracking system. The graph 503 corresponds to a two tone simulation including a tone of 180 MHz and a tone of 182 MHz.

Figure 8:
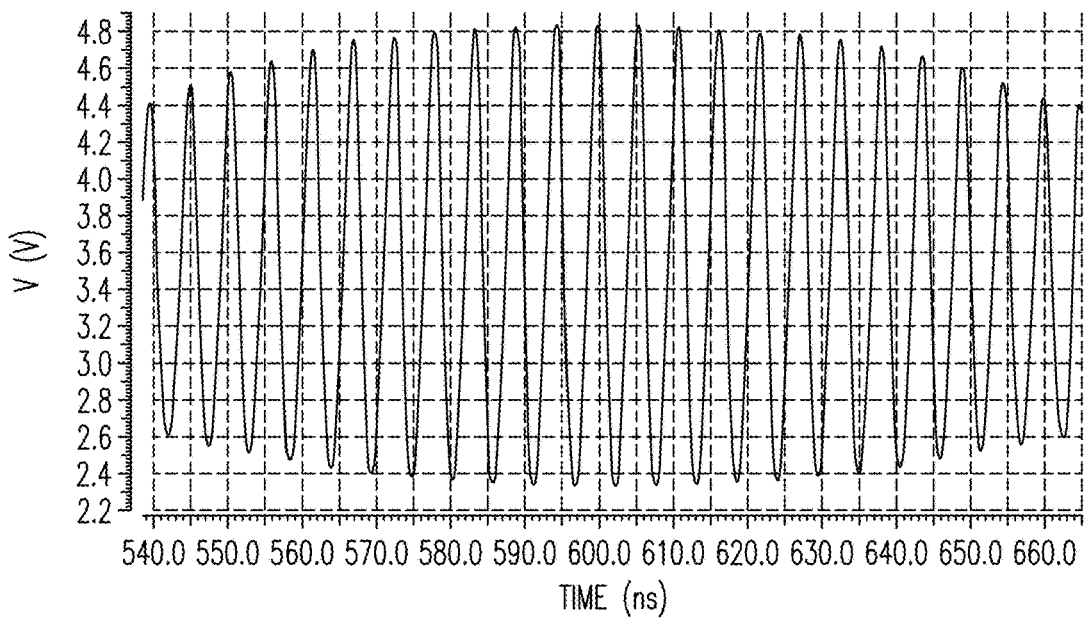
FIG. 8 is another example of a graph of voltage for versus time for an envelope tracking system.

FIG. 8 is another example of a graph of voltage for versus time for an envelope tracking system. The graph of FIG. 8 corresponds to a portion of the graph 503 of FIG. 7 between 540 ns and 660 ns.

Although various example of performance characteristics for an envelope tracking system have been shown, other results are possible. For example, the performance characteristics of an envelope tracking system can depend on implementation, application, simulation or lab setup, operating conditions, and/or a wide variety of other factors.

Figure 9A:
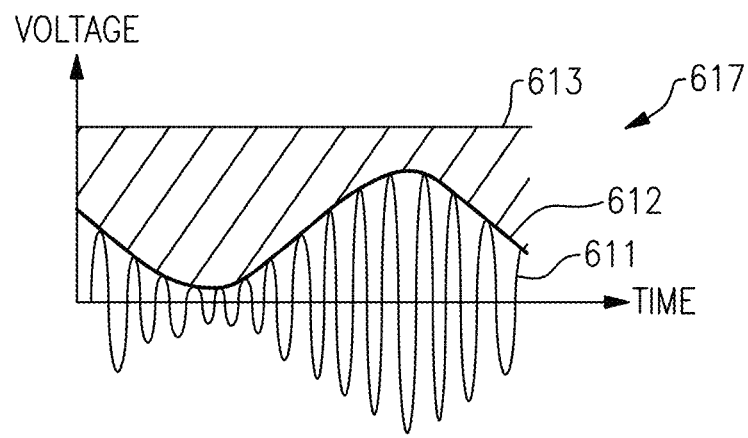
FIG. 9A is a graph showing a first example of power amplifier supply voltage versus time.

FIG. 9A is a graph 617 showing a first example of power amplifier supply voltage versus time. The graph 617 illustrates the voltage of an RF signal 611, the RF signal's envelope 612, and a power amplifier supply voltage 613 versus time. The graph 617 corresponds to one example of waveforms for an implementation in which the power amplifier supply voltage 613 is substantially fixed.

It can be important that the power amplifier supply voltage 613 of a power amplifier has a voltage greater than that of the RF signal 611. For example, powering a power amplifier using a power amplifier supply voltage that has a magnitude less than that of the RF signal can clip the RF signal, thereby creating signal distortion and/or other problems. Thus, it can be important the power amplifier supply voltage 613 be greater than that of the envelope 612. However, it can be desirable to reduce a difference in voltage between the power amplifier supply voltage 613 and the envelope 612 of the RF signal 611, as the area between the power amplifier supply voltage 613 and the envelope 612 can represent lost energy, which can reduce battery life and increase heat generated in a wireless device.

Figure 9B:
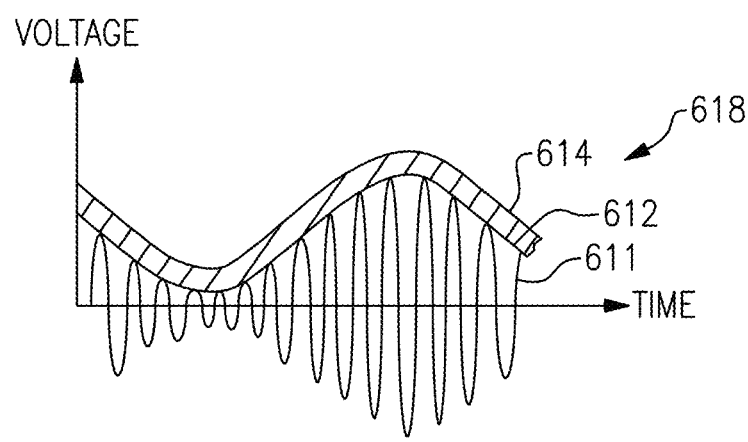
FIG. 9B is a graph showing a second example of power amplifier supply voltage versus time.

FIG. 9B is a graph 618 showing a second example of power amplifier supply voltage versus time. The graph 618 illustrates the voltage of an RF signal 611, the RF signal's envelope 612, and a power amplifier supply voltage 614 versus time. The graph 618 corresponds to one example of waveforms for an implementation in which the power amplifier supply voltage 614 is generated by envelope tracking.

In contrast to the power amplifier supply voltage 613 of FIG. 9A, the power amplifier supply voltage 614 of FIG. 9B changes in relation to the envelope 612 of the RF signal 611. The area between the power amplifier supply voltage 614 and the envelope 612 in FIG. 9B is less than the area between the power amplifier supply voltage 613 and the envelope 612 in FIG. 9A, and thus the graph 618 of FIG. 9B can be associated with an envelope tracking system having greater energy efficiency.

Figure 10:
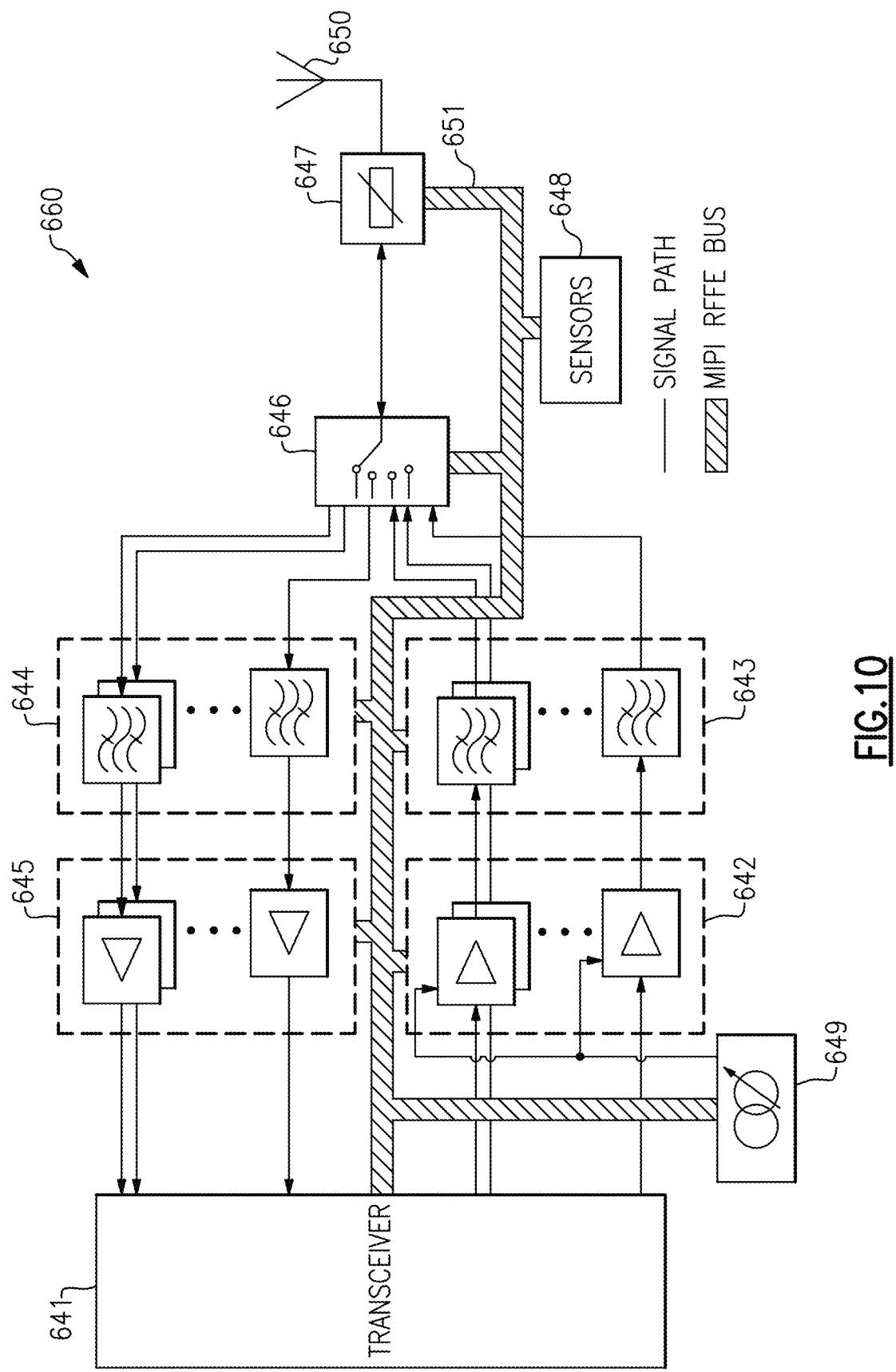
FIG. 10 is a schematic diagram of another embodiment of a communication system.

FIG. 10 is a schematic diagram of another embodiment of a communication system 660. The communication system 660 further includes a transceiver 641, a power amplifier module 642, a transmit filter module 643, a receive filter module 644, a low noise amplifier (LNA) module 645, an antenna switch module 646, a coupler module 647, a sensor module 648, a power management module 649, an antenna 650, and a MIPI RFFE bus 651.

As shown in FIG. 10, various components of the communication system 660 are interconnected by the MIPI RFFE bus 651. Additionally, the transceiver 641 includes a master device of the MIPI RFFE bus 651, and each of the RF components includes a slave device of the MIPI RFFE bus 651. The master device of the transceiver 641 sends control commands over the MIPI RFFE bus 651 to configure the communication system 660 during initialization and/or while operational.

The power amplifier module 642 can include one or more power amplifiers. As shown in FIG. 10, the power amplifier module 642 receives one or more power amplifier supply voltages from the power management module 649. The power management module 649 can include an envelope tracker that generates at least one power amplifier supply voltage, and that is implemented in accordance with the teachings herein.

Although FIG. 10 illustrates one example of a communication system including a power management module and a power amplifier module, the teachings herein are applicable to communication systems implemented in a wide variety of ways.

Figure 11A:
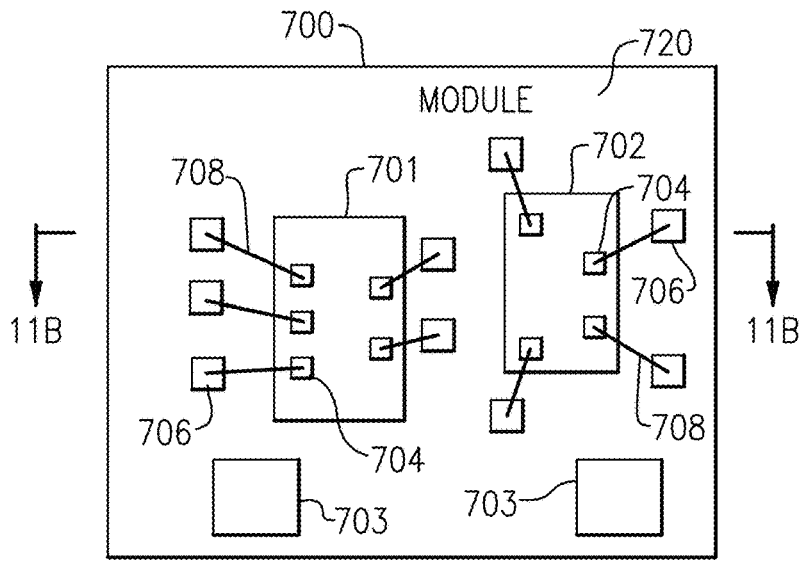
FIG. 11A is a schematic diagram of one embodiment of a packaged module.
Figure 11B:
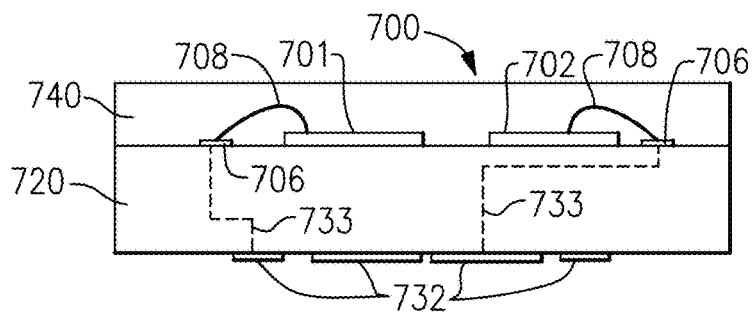
FIG. 11B is a schematic diagram of a cross-section of the packaged module of FIG. 11A taken along the lines 11B-11B.

FIG. 11A is a schematic diagram of one embodiment of a packaged module 700. FIG. 11B is a schematic diagram of a cross-section of the packaged module 700 of FIG. 11A taken along the lines 11B-11B. The packaged module 700 illustrates an example of a module that can include circuitry implemented in accordance with one or more features of the present disclosure.

The packaged module 700 includes a first die 701, a second die 702, surface mount components 703, wirebonds 708, a package substrate 720, and encapsulation structure 740. The package substrate 720 includes pads 706 formed from conductors disposed therein. Additionally, the dies 701, 702 include pads 704, and the wirebonds 708 have been used to connect the pads 704 of the dies 701, 702 to the pads 706 of the package substrate 720.

In certain implementations, the dies 701, 702 are manufactured using different processing technologies. In one example, the first die 701 is manufactured using a compound semiconductor process, and the second die 702 is manufactured using a silicon process. Although an example with two dies is shown, a packaged module can include more or fewer dies.

The packaging substrate 720 can be configured to receive a plurality of components such as the dies 701, 702 and the surface mount components 703, which can include, for example, surface mount capacitors and/or inductors.

As shown in FIG. 11B, the packaged module 700 is shown to include a plurality of contact pads 732 disposed on the side of the packaged module 700 opposite the side used to mount the dies 701, 702. Configuring the packaged module 700 in this manner can aid in connecting the packaged module 700 to a circuit board such as a phone board of a wireless device. The example contact pads 732 can be configured to provide RF signals, bias signals, ground, and/or supply voltage(s) to the dies 701, 702 and/or the surface mount components 703. As shown in FIG. 11B, the electrically connections between the contact pads 732 and the dies 701, 702 can be facilitated by connections 733 through the package substrate 720. The connections 733 can represent electrical paths formed through the package substrate 720, such as connections associated with vias and conductors of a multilayer laminated package substrate.

In some embodiments, the packaged module 700 can also include one or more packaging structures to, for example, provide protection and/or facilitate handling of the packaged module 700. Such a packaging structure can include overmold or encapsulation structure 740 formed over the packaging substrate 720 and the components and die(s) disposed thereon.

It will be understood that although the packaged module 700 is described in the context of electrical connections based on wirebonds, one or more features of the present disclosure can also be implemented in other packaging configurations, including, for example, flip-chip configurations.

Figure 12:
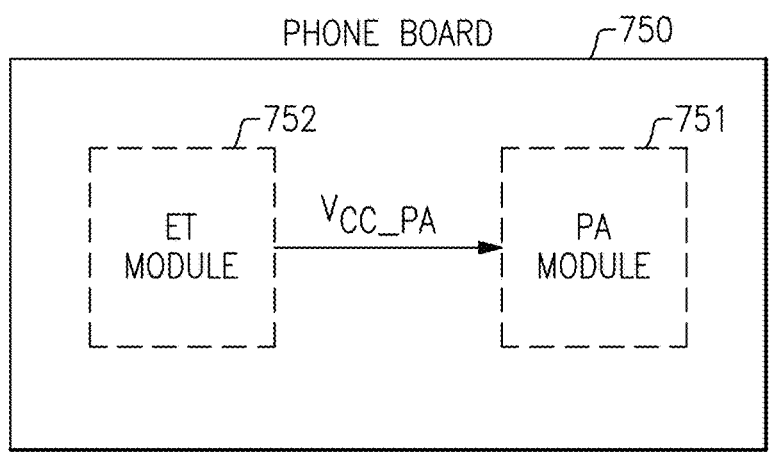
FIG. 12 is a schematic diagram of one embodiment of a phone board.

FIG. 12 is a schematic diagram of one embodiment of a phone board 750. The phone board 750 includes an envelope tracking module 752 and a power amplifier module 751 attached thereto. In certain configurations, the power amplifier module 751 and/or the envelope tracking module 752 are implemented using a module similar to that of the module 700 shown in FIGS. 11A-11B. As shown in FIG. 12, the envelope tracking module 752 provides a power amplifier supply voltage $V_{CC\_PA}$ to the power amplifier module 751. Additionally, the envelope tracking module 752 controls the power amplifier supply voltage $V_{CC\_PA}$ to change in relation to the envelope of an RF signal amplified by the power amplifier module 751.

Although not illustrated in FIG. 12 for clarity, the phone board 750 typically includes additional components and structures.

Figure 13:
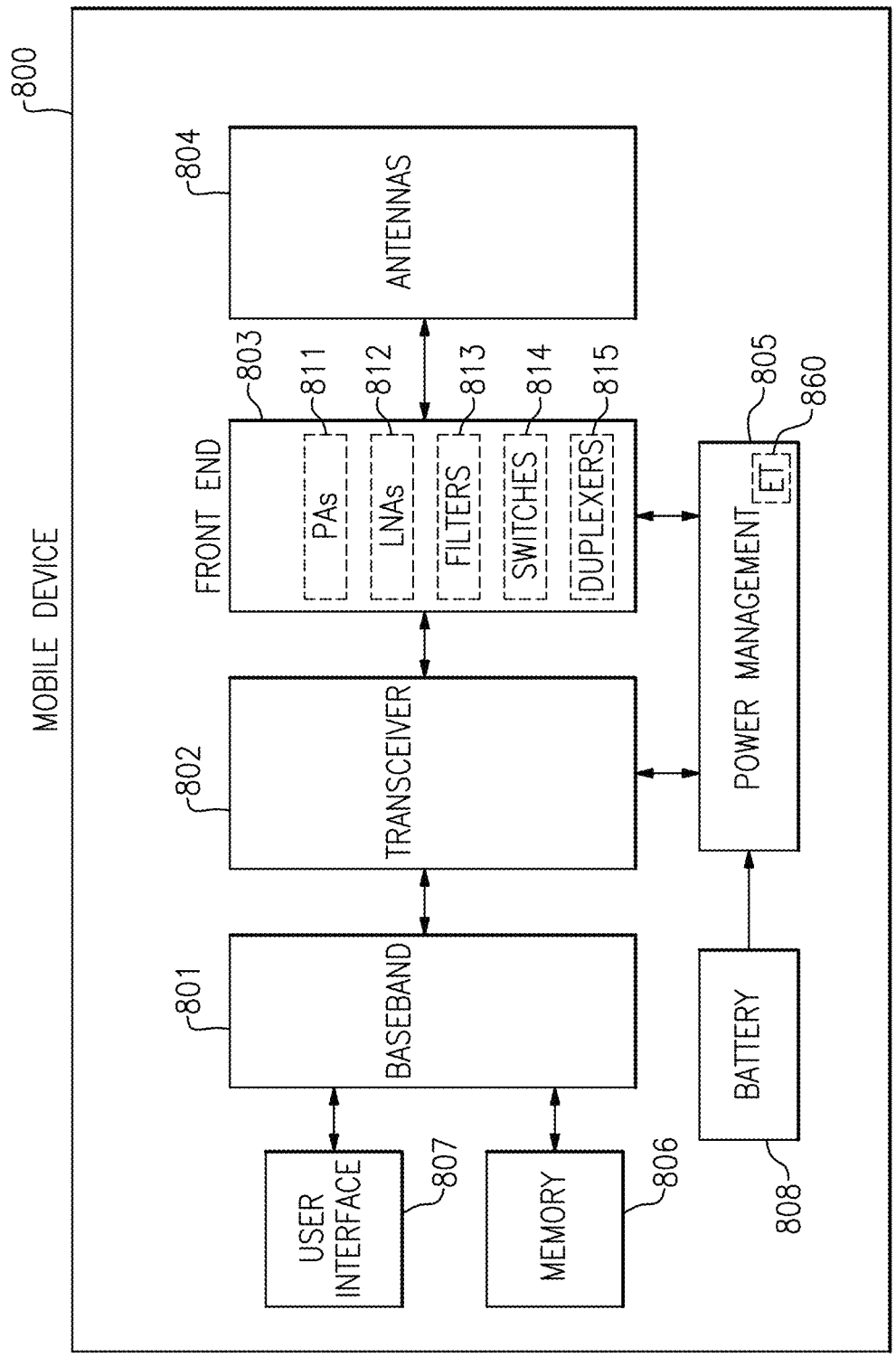
FIG. 13 is a schematic diagram of one embodiment of a mobile device.

FIG. 13 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 13 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 13, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. The power management system 805 can include an envelope tracker 860 implemented in accordance with one or more features of the present disclosure.

As shown in FIG. 13, the power management system 805 receives a battery voltage form the battery 808. The battery 808 can be any suitable battery for use in the mobile device 800, including, for example, a lithium-ion battery.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a radio frequency transmit signal;
a front end circuit including a power amplifier configured to amplify the radio frequency transmit signal; and
a power management circuit including an envelope tracker configured to generate a power amplifier supply voltage of the power amplifier, the envelope tracker including a differential amplification circuit including an output configured to adjust a voltage level of the power amplifier supply voltage, a first input connected to a transistor gate, the first input controlled by a reference voltage, a second input connected to at least one of a transistor source or a transistor drain, the second input controlled by an envelope signal that changes in relation to an envelope of the radio frequency transmit signal, and a control input configured to receive a control signal that controls a bias of the differential amplification circuit, the envelope tracker further including an input current reduction circuit electrically connected to the output and the second input and configured to control the control signal to set an input current to the second input.

2. The mobile device of claim 1 wherein the input current reduction circuit includes a first resistor electrically connected between an envelope input that receives the envelope signal and the second input of the differential amplification circuit, and a second resistor electrically connected between the second input and the output of the differential amplification circuit.

3. The mobile device of claim 2 wherein the input current reduction circuit further includes a control amplifier including a first control input connected to the second input of the differential amplification circuit and a control output configured to generate the control signal.

4. The mobile device of claim 3 wherein the input current reduction circuit further includes a third resistor connected between the envelope input and a second control input of the control amplifier, and a fourth resistor connected between the second control input and the output of the differential amplification circuit.

5. The mobile device of claim 4 wherein the third resistor is scaled in size from the first resistor by a scaling factor, and the fourth resistor is scaled in size from the second resistor by the scaling factor.

6. The mobile device of claim 5 wherein the scaling factor is 5 or more.

7. A mobile device comprising:
a transceiver configured to generate a radio frequency transmit signal;
a front end circuit including a power amplifier configured to amplify the radio frequency transmit signal; and
a power management circuit including an envelope tracker configured to generate a power amplifier supply voltage of the power amplifier, the envelope tracker including a differential amplification circuit including an output configured to adjust a voltage level of the power amplifier supply voltage, a first input connects to a differential input buffer, the first input controlled by a reference voltage, and a second input that does not connect to any differential input buffer, the second input controlled by an envelope signal that changes in relation to an envelope of the radio frequency transmit signal, and a control input configured to receive a control signal that controls a bias of the differential amplification circuit, the envelope tracker further including an input current reduction circuit electrically connected to the output and the second input and configured to control the control signal to set an input current to the second input.

8. The mobile device of claim 7 wherein the envelope tracker further includes a switching regulator configured to generate a regulated voltage, and a combiner configured generate the power amplifier supply voltage based on combining the regulated voltage and an output current from the output of the differential amplification circuit.

9. An envelope tracking system comprising:
a power amplifier configured to amplify a radio frequency transmit signal; and
an envelope tracker configured to generate a power amplifier supply voltage of the power amplifier, the envelope tracker including a differential amplification circuit including an output configured to adjust a voltage level of the power amplifier supply voltage, a first input connected to a transistor gate, the first input controlled by a reference voltage, a second input connected to at least one of a transistor source or a transistor drain, the second input controlled by an envelope signal that changes in relation to an envelope of the radio frequency transmit signal, and a control input configured to receive a control signal that controls a bias of the differential amplification circuit, the envelope tracker further including an input current reduction circuit electrically connected to the output and the second input and configured to control the control signal to set an input current to the second input.

10. The envelope tracking system of claim 9 wherein the input current reduction circuit includes a first resistor electrically connected between an envelope input that receives the envelope signal and the second input of the differential amplification circuit, and a second resistor electrically connected between the second input and the output of the differential amplification circuit.

11. The envelope tracking system of claim 10 wherein the input current reduction circuit further includes a control amplifier including a first control input connected to the second input of the differential amplification circuit and a control output configured to generate the control signal.

12. The envelope tracking system of claim 11 wherein the input current reduction circuit further includes a third resistor connected between the envelope input and a second control input of the control amplifier, and a fourth resistor connected between the second control input and the output of the differential amplification circuit.

13. The envelope tracking system of claim 12 wherein the third resistor is scaled in size from the first resistor by a scaling factor, and the fourth resistor is scaled in size from the second resistor by the scaling factor.

14. The envelope tracking system of claim 13 wherein the scaling factor is 5 or more.

15. An envelope tracking system comprising:
a power amplifier configured to amplify a radio frequency transmit signal; and
an envelope tracker configured to generate a power amplifier supply voltage of the power amplifier, the envelope tracker including a differential amplification circuit including an output configured to adjust a voltage level of the power amplifier supply voltage, a first input connected to a differential input buffer, the first input controlled by a reference voltage, and a second input does not connect to any differential input buffer, the second input controlled by an envelope signal that changes in relation to an envelope of the radio frequency transmit signal, and a control input configured to receive a control signal that controls a bias of the differential amplification circuit, the envelope tracker further including an input current reduction circuit electrically connected to the output and the second input and configured to control the control signal to set an input current to the second input.

16. The envelope tracking system of claim 15 wherein the envelope tracker further includes a switching regulator configured to generate a regulated voltage, and a combiner configured generate the power amplifier supply voltage based on combining the regulated voltage and an output current from the output of the differential amplification circuit.

17. A method of envelope tracking, the method comprising:
amplifying a radio frequency signal using a power amplifier;
adjusting a power amplifier supply voltage of the power amplifier using a differential amplification circuit of an envelope tracker, including receiving a reference voltage at a first input of the differential amplification circuit, the first input connected to a transistor gate, receiving an envelope signal that changes in relation to an envelope of the radio frequency signal at a second input of the differential amplification circuit, the second input connected to at least one of a transistor source or a transistor drain, and adjusting a voltage level of the power amplifier supply voltage using an output of the differential amplification circuit; and
controlling a bias of the differential amplification circuit to set an input current to the second input using an input current reduction circuit of the envelope tracker, the input current reduction circuit electrically connected to the output and the second input of the differential amplification circuit.

18. The method of claim 17 further comprising generating a regulated voltage using a switching regulator of the envelope tracker, and combining the regulated voltage and an output current of the differential amplification circuit using a combiner of the envelope tracker.

19. The method of claim 17 wherein the input current reduction circuit further comprises a control amplifier, and electrically connecting a first resistor between an envelope input and the second input of the differential amplification circuit, and electrically connecting a second resistor between an input of the envelope tracker and a control input of the control amplifier.

20. The method of claim 19 further comprising scaling the second resistor by at least a factor of five in size from the size of the first resistor.

* * * * *